United States Patent [19]

Motohashi

[11] 4,419,767
[45] Dec. 6, 1983

[54] AUTOMATIC DIGITAL CONTROL DEVICE FOR EXACT FREQUENCY TUNING OF A RECEIVER

[75] Inventor: Minoru Motohashi, Saitama, Japan

[73] Assignee: Pioneer Electronic Corporation, Tokyo, Japan

[21] Appl. No.: 324,705

[22] Filed: Nov. 24, 1981

[30] Foreign Application Priority Data

Nov. 27, 1980 [JP] Japan .................. 55-167096
Dec. 4, 1980 [JP] Japan .................. 55-171207

[51] Int. Cl.³ .............................. H03J 7/22
[52] U.S. Cl. ..................... 455/164; 455/169
[58] Field of Search ............. 455/161, 164, 165, 169; 358/193.1, 195.1

[56] References Cited

U.S. PATENT DOCUMENTS

4,264,976 4/1981 Yamashita ..................... 455/161

FOREIGN PATENT DOCUMENTS

54-46406 4/1979 Japan ..................... 455/164
55-118218 9/1980 Japan ..................... 455/169

*Primary Examiner*—Jin F. Ng
*Attorney, Agent, or Firm*—Sughrue, Mion, Zinn, Macpeak & Seas

[57] ABSTRACT

In a voltage synthesizer type receiver in which the tuning frequency is varied in first and second directions and in which a tuning frequency is automatically obtained in response to detuning detection signals produced from a window comparator, a hysteresis characteristic of the window comparator is compensated for by using a second up/down counter to control the tuning frequency variation in the second direction so that it terminates half way between the trailing edge of a first detection signal and the leading edge of a second detection signal so that exact tuning is accomplished.

9 Claims, 8 Drawing Figures

AUTOMATIC DIGITAL CONTROL DEVICE FOR EXACT FREQUENCY TUNING OF A RECEIVER

BACKGROUND OF THE INVENTION

The present invention relates to a tuning frequency automatic control device of a receiver, and more particularly to a voltage synthesizer type tuning frequency automatic control device of a receiver which is capable of automatically selecting broadcasting stations.

In a receiver of a voltage synthesizer type, as shown in FIG. 1, after being amplified by an RF amplifier 1, an RF (radio frequency) reception signal is subjected to frequency conversion by a mixer 2 to provide an IF (intermediate frequency) signal which is in turn provided through an IF amplifier 3 to an FM detector 4. The FM detector 4 is provided with a frequency discriminating function and it produces an output having an S-curve characteristic relative to the frequency variation. The S-curve output voltage is applied to a window comparator 5 to provide detection signals $S_1$ and $S_2$ when the S-curve output voltage is out of a particular range. These detection signals $S_1$ and $S_2$ are used to indicate detuning conditions.

A controller 6 implements a desired operation in response to the detuning detection signals $S_1$ and $S_2$ as well as up-instruction and down-instruction signals. The controller 6 produces a control voltage to be applied to a VCO (voltage controlled oscillator) 7. The output of the VCO 7 is used as a local oscillation signal to be applied to the mixer 2, thereby automatically controlling the tuning frequency.

FIG. 2 is a waveform diagram for description of one operation mode of the voltage synthesizer type receiver as shown in FIG. 1, which has been proposed by the applicant. When the up-instruction signal is applied from an external source, clock pulses of a predetermined frequency are up-counted by an up/down counter contained in the controller 6. In accordance with the count value in the counter, a DC voltage is generated by a combination of a D/A converter and a LPF (lowpass filter) and the DC voltage thus generated serves to vary the oscillation frequency of VCO 7, thereby increasing the tuning frequency.

When the S-curve output level falls below a lower threshold value $V_D$ of the window comparator 5 at time $t_1$, the detuning detection signal $S_1$ is produced from the comparator 5. In response to the signal $S_1$, the clock pulses are subjected to frequency division, for example ⅛ frequency division, so as to lower the searching speed, and the clock pulses thus frequency divided are fed to the up/down counter so as to effect up counting. The reason for lowering the searching speed is to cover the delay caused by the time constant of the LPF which produces the DC voltage output of the control circuit. When the frequency enters into a tuning range at time $t_2$, the detection signal $S_1$ goes down to L level and the window comparator 5 no longer produces the signal $S_1$. From this time instant, the frequency is further increased while maintaining the searching speed unchanged. Another detuning signal $S_2$ is produced at time $t_3$ when the S-curve output level reaches the upper threshold value $V_U$ of the window comparator 5. In order to measure the time period from $t_2$ to $t_3$, another up/down counter is employed which effects up-counting of one-half of the clock pulses (4) generated in this time period. In response to the detection signal $S_2$, the frequency controlling up/down counter is operated to effect down-counting, thereby decreasing the frequency. This frequency lowering period is set to one-half of the frequency rising period from time $t_2$ until time $t_3$ so that exact tuning is accomplished by the decrementing of the frequency during this lowering period. The time measuring up-down counter is controlled to effect down-counting of the clock pulses and is halted at time $t_5$ when the count value of the time measuring up/down counter becomes zero. Then a borrow output is produced and exact tuning is accomplished.

In the above-described operation, it is a common practice to attempt prevention of a chattering phenomenon so that the detection outputs are stably produced. This is typically achieved by providing a hysteresis to the level comparison characteristic of the window comparator 5. Therefore, the correlation of the productions of the detection signal $S_1$ and $S_2$ relative to the S-curve level are different depending upon the variation direction of the tuning frequency. As a result, however, the tuning accuracy is degraded.

Such a phenomenon will be described in far more detail with reference to the operational waveform diagram shown in FIG. 3. When the frequency is increased at a predetermined speed in an up direction as indicated by an arrow A, the time period from the falling edge of the detection signal $S_1$ until the rising edge of the subsequent detection signal $S_2$ is designated by T. In the case when the frequency is varied at the same predetermined speed in a down direction as indicated by an arrow B in response to the detection signal $S_2$, the falling edge of the detection signal $S_2$ has a time lag Ta with respect to the corresponding edge of the signal $S_2$ in the up direction. Therefore, even if the searching operation is terminated at the time when T/2 has passed since the detection of the detection signal $S_2$, the tuning point does not coincide with the center ($f_0$) of the S-curve but the tuning point shifts to a higher frequency than the center frequency $f_0$. On the other hand, in the case when after varying the frequency in the down direction as indicated by the arrow B, the frequency is then varied in the up direction upon detection of the detection signal $S_1$, the tuning point shifts to a lower frequency than the center frequency $f_0$. Thus, it is disadvantageous in that exact tuning cannot be accomplished. Furthermore, the above-described operation is disadvantageous in that the searching time is increased due to the fact that the searching speed is decreased immediately after the frequency enters into the S-curve frequency band. It should be noted that the frequency band of the S-curve characteristic of the FM detector is considerably wide.

SUMMARY OF THE INVENTION

Accordingly, an object of this invention is to provide a tuning frequency automatic control device of a receiver capable of carrying out a rapid searching operation while effecting exact tuning.

In order to implement the object of this invention, it is necessary to correct the time lag Ta which occurs at the time of the rising and falling edges of the detection signals $S_1$ and $S_2$ in the up and down directions, respectively, which time lag is caused by the hysteresis characteristic provided with the window comparator. It is also necessary to do this while maintaining the high speed searching. Referring again to FIG. 3, if the tuning is effected by varying the frequency in the up direction and thereafter by varying it in the down direction, the down period should be set to $Ta+(T-Ta)/2$. On the other hand, if the tuning is effected by varying the frequency in the down direction and thereafter by varying it in the up direction, the up period should also be set to $Ta+(T-Ta)/2$ similar to the above.

Accordingly, in the tuning frequency automatic control device of the receiver in accordance with the invention, in which is included a level comparison means provided with a hysteresis characteristic which produces detection signals indicative of detuning conditions when an output level detected from a frequency discriminator is out of a predetermined range, and in which tuning is effected by varying a tuning frequency in up and down directions in response to the detection signals, an important feature of the invention resides in the provision of a first frequency variable means for varying the frequency at a predetermined speed in a first direction in response to the production of a first detection signal of the level comparison means; second frequency variable means for varying the frequency at the predetermined speed in a second direction reverse to the first direction in response to a second detection signal produced subsequent to the first detection signal; and halt signal generating means for halting the variation of the frequency after passing a time period of $Ta+(T-Ta)/2$ from the production of the second detection signal wherein T is a time period measured from the occurrence of the first detection signal until the occurrence of the second detection signal and Ta is the duration of the occurrence of the second detection signal.

In a preferred embodiment of the invention, the first and the second frequency variable means include a common up/down counter, the first frequency variable means supplies clock pulses of a predetermined frequency to the up/down counter as the first direction input, and the second frequency variable means supplies the clock pulses to the up/down counter as the second directional input. The tuning frequency is controlled in accordance with the count value of the common up/down counter.

Furthermore, the half signal generating means includes a time measuring up/down counter, the latter counter receives as the first directional count input clock pulses having one-half of the predetermined frequency of the clock pulses generated during a period from the occurrence of the first detection signal, and receives the half frequency clock pulses as the second directional count input generated during the period of the occurrence of the second detection signal, and the clock pulses of the predetermined frequency are supplied to the time measuring up/down counter as the second directional count input in response to the absence of the second detection signal. A borrow output of the time measuring up/down counter is used as a frequency variation halt signal.

DETAILED DESCRIPTION OF THE PREFERRED EMBODIMENTS

This invention will now be described with reference to the accompanying drawings.

Figure 2:
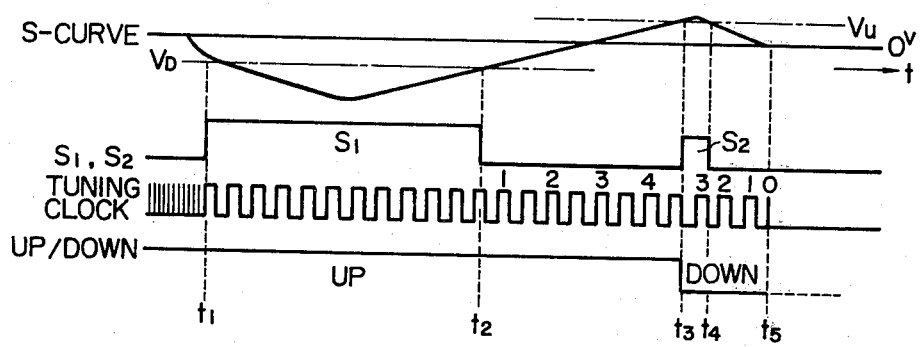
FIG. 2 is a waveform diagram illustrating one example of the controlling operation of the circuitry of FIG. 1 as proposed by the present applicant.
Figure 3:
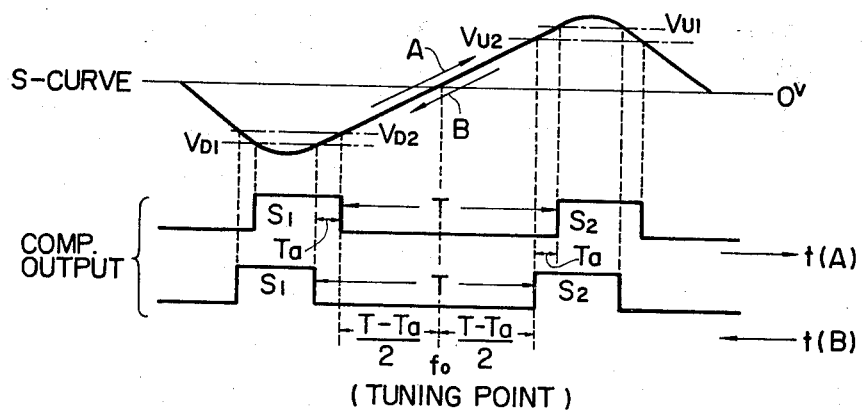
FIG. 3 is an explanatory diagram for description of the relation of a comparator output and a detection output as produced in the circuit block diagram in FIG. 1.
Figure 4:
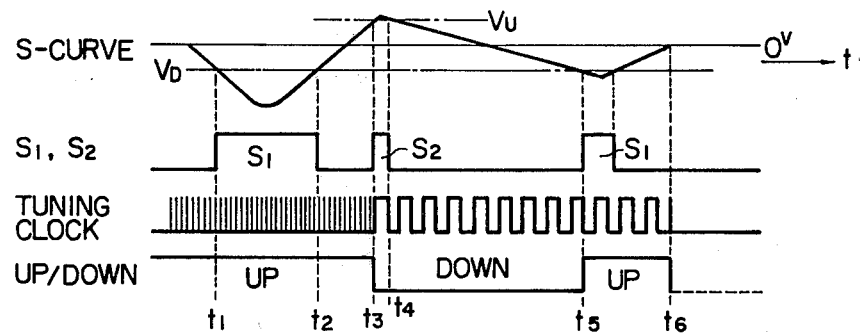
FIG. 4 is a waveform diagram for description of a controlling operation according to a first embodiment of the invention.

FIG. 4 is a waveform diagram for description of the controlling operation according to a first embodiment of the invention. When an up-instruction signal of a tuning frequency is given from an external source, clock pulses having a predetermined frequency are up-counted by an up/down counter. In accordance with the count value, the oscillation frequency of VCO 7 is varied and the tuning frequency is increased in sequence similar to the operation as described in conjunction with FIG. 2. When the S-curve output level falls below the lower threshold value $V_D$ of a window comparator 5 at time $t_1$, a detuning detection signal $S_1$ is produced from the comparator 5. At this time instant, high speed frequency change is carried out without changing the searching speed, because the clock pulses are fed to the up/down counter without being subjected to frequency division. At time $t_2$ when the frequency enters in the tuning range, the detection signal $S_1$ falls to L level. However, the frequency continues to be increased at the high speed. When the S-curve level reaches the upper threshold value $V_U$ of the comparator at time $t_3$, a detection signal $S_2$ is produced. In response to the signal $S_2$, the clock pulses are subjected to frequency division, for example ⅛ frequency division, resulting in the lowering of the searching speed. The up/down counter is then controlled to effect down-counting of the clock pulses thus frequency divided. The low speed searching operation in the down direction continues until time $t_5$ at which the S-curve output falls down to the lower threshold value $V_D$ of the comparator. In response to the direction signal $S_1'$ at time $t_5$, the up/down counter is again controlled to effect upcounting. The low speed searching operation in the up direction is carried out for the duration from $t_5$ to $t_6$ which is exactly a half of the duration of the searching operation in the down direction, i.e. $t_5-t_4$, and then the searching operation is halted. The time control of the low speed searching operation in the up direction is implemented by a time measuring up/down counter in the same manner as in the case of FIG. 2.

Figure 1:
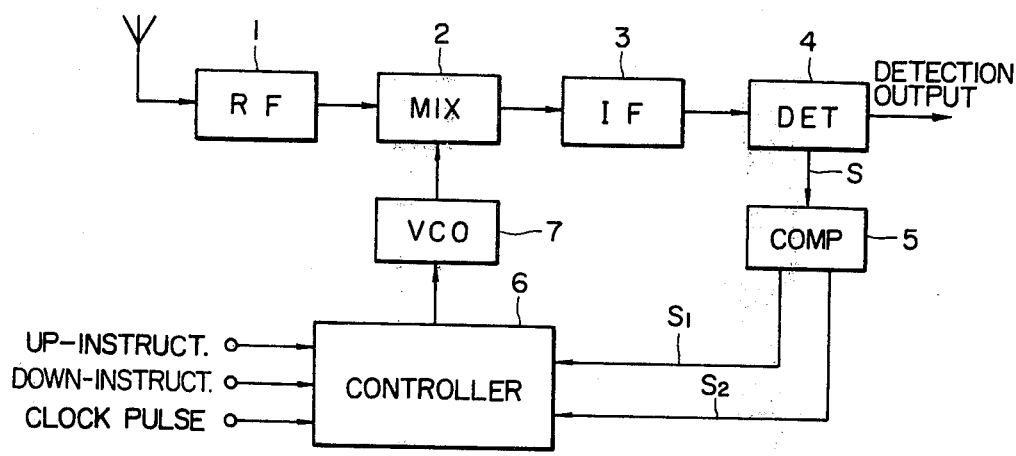
FIG. 1 is a block diagram showing a part of a conventional receiver section including a tuning frequency automatic control device.
Figure 7:
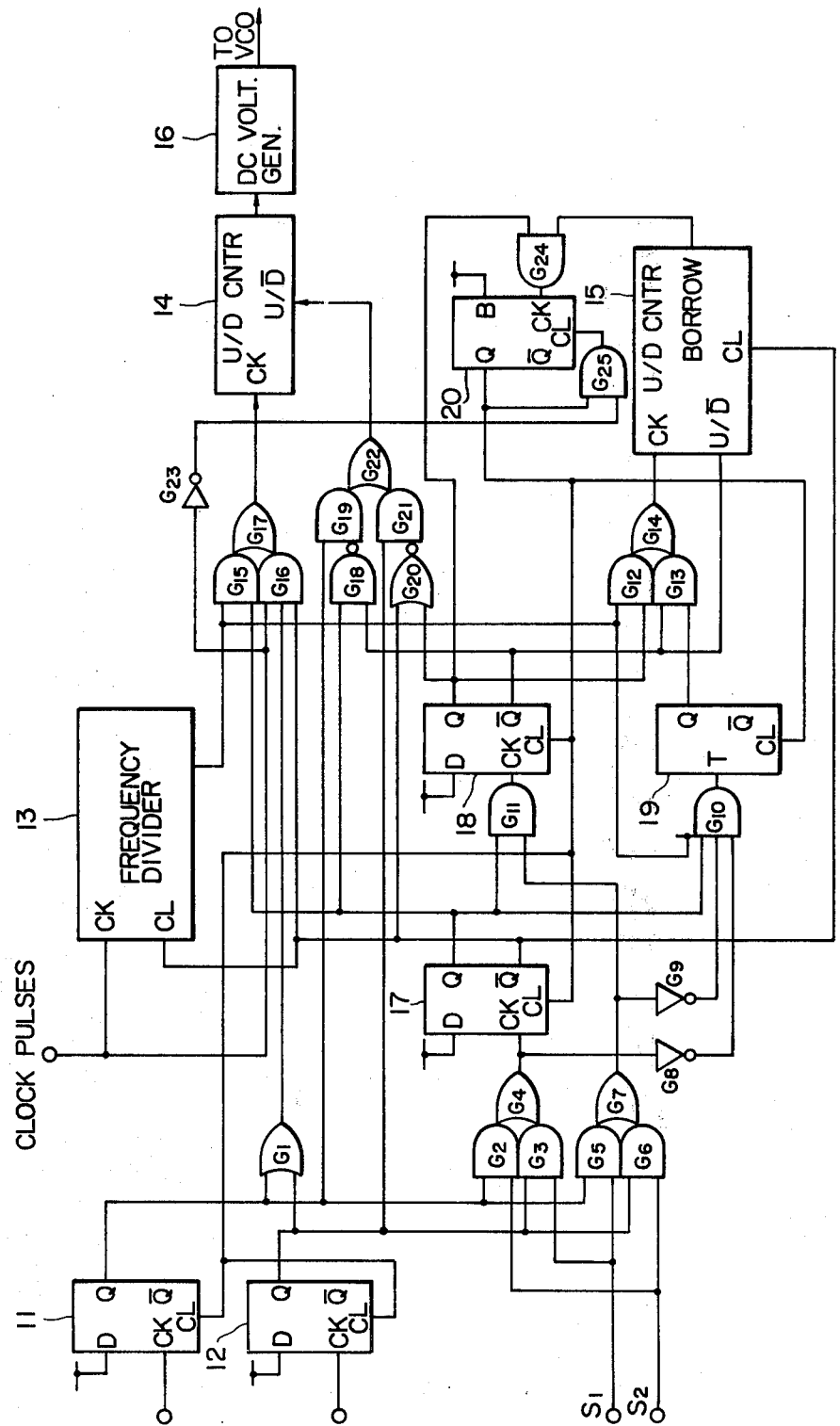
FIGS. 7 and 8 are circuit diagrams of the first and second embodiments of the invention, respectively.

FIG. 7 is a circuit diagram for carrying out the above-described controlling operation. Flip-flops (hereinafter referred to as "FF") 11 and 12 store the up and down instructions and produce the corresponding outputs, respectively. A gate circuit constructed with AND gates $G_2$, $G_3$, $G_5$ and $G_6$ and OR gates $G_4$ and $G_7$ serves to selectively deliver either the up-instruction or the down-instruction to the following control sections in response to the detuning detection signals $S_1$ or $S_2$. A frequency divider 13 operates to divide the frequency of the clock pulses by 8, for example and the output thereof is applied through a gate circuit including AND gates $G_{15}$ and $G_{16}$ and an Or gate $G_{17}$ to the clock input CK of an up/down counter 14, and is also applied through another gate circuit including AND gate $G_{12}$, $G_{13}$ and an OR gate $G_{14}$ to the clock input CK of a time measuring up/down counter 15. The count output of the up/down counter 14 is applied to a DC voltage generator 16 including a D/A converter and a LPF, and the output of the DC voltage generator 16 is applied as a control voltage to the VCO 7 (see FIG. 1).

A borrow output of the time measuring up/down counter 15 is applied through an AND gate $G_{24}$ to the clock input CK of an FF 20 to control the content thereof. In response to the Q output of FF 20, controlling FFs 17, 18 and 19 and the input latching FFs 11 and 12 are cleared, thereby halting the searching operation.

More specifically, when the up-instruction signal is received, the Q output of FF 11 becomes H level which is applied through an OR gate $G_1$ to the AND gate $G_{16}$. On the other hand, since the $\overline{Q}$ output of FF 17 is at H level, the AND gate $G_{16}$ is enabled so that the clock pulses are permitted to pass through the OR gate $G_{17}$ and are fed to the clock terminal CK of the up/down counter 14. At this time, since an AND gate $G_{19}$ is enabled, an H level signal is applied through OR gate $G_{22}$ to the up/down terminal of the counter 14 so that the latter counter effects an up-counting operation, thereby carrying out a high speed up-searching operation.

An AND gate $G_{11}$ is maintained disabled even if the first detection signal $S_1$ is produced at a time $t_1$, so that the condition of FF 18 is not changed and thus the output of an OR gate $G_{22}$ is maintained at H level. Furthermore, since the condition of FF 17 does not change, the gate $G_{17}$ still permits the clock pulses to be fed to the clock terminal CK of the counter 14, thereby continuing the high speed up-searching.

In accordance with the occurrence of the second detection signal $S_2$ at time $t_3$, FF 17 is set and the clear conditions of the frequency divider 13 and the time measuring up/down counter 15 are dissolved. The gate $G_{16}$ is disabled and the gate $G_{15}$ is enabled so that the clock pulses which are subjected to $\frac{1}{8}$ frequency division are now fed to the clock terminal CK of the up/down counter 14. In addition, since the gate $G_{19}$ is also disabled, both inputs of the gate $G_{22}$ are at L levels and thus the up/down instruction signal to the counter 14 is changed from H to L, thereby commencing the down direction counting operation.

When the detection signal $S_2$ changes to L level at time $t_4$, a gate $G_{10}$ is enabled. The frequency divided output of the frequency divider 13 is further subjected to $\frac{1}{2}$ frequency division by FF 19 and the resultant output is fed through the gates $G_{13}$ and $G_{14}$ to the clock terminal CK of the time measuring up/down counter 15. At this time, since the up/down instruction signal of the counter 15 is at H level, up-counting is effected therein. When the reception frequency gradually decreases, the third detection signal $S_1'$ is produced. As a result, FF 18 is set and the output of the gate $G_{18}$ changes to H level. Accordingly, the up/down instruction signal of the up/down counter 14 again changes to H level to cause it to effect up-counting, and correspondingly the reception frequency is increased. On the other hand, the time measuring up/down counter 15 now receives the down instruction to cause it to effect down-counting. At this time, the clock input of the counter 15 is the output of the frequency divider 13 because the gate $G_{13}$ is disabled and the gate $G_{12}$ is enabled. When the borrow output of the counter 15 is outputted, FF 20 is set and the remaining FFs 17, 18 and 19 are cleared, thus terminating the searching operation.

From the foregoing description, it can be appreciated that in the duration from time $t_4$ until time $t_5$, the time measuring up/down counter 15 effects up-counting of one-half of the output pulses of the frequency divider 13, i.e. one-half of the eight pulses shown in FIG. 4, while in the duration from time $t_5$ to time $t_6$, the time measuring up/down counter 15 effects down-counting of all of the output pulses of the frequency divider 13. Therefore, the borrow output is produced after only four input clock pulses from the divider 13 at which time the S-curve output is at a zero level indicating an optimum tuning point.

As described above, the searching speed is not lowered after the occurrence of the first detuning detection signal but only after the occurrence of the second detection signal. Accordingly, it will be apparent that the tuning control speed is remarkably increased in comparison with the operational mode as described in FIG. 2.

Figure 5:
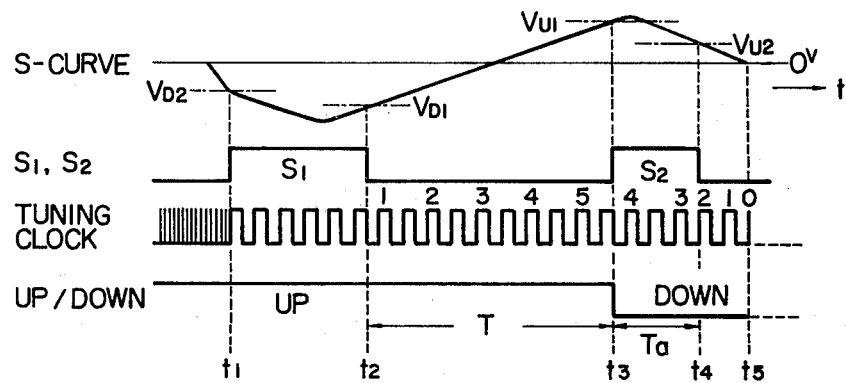
FIGS. 5 and 6 are waveform diagrams for description of the controlling operation according to a second embodiment of the invention.

FIG. 5 is a waveform diagram for description of a second embodiment of the invention. When the S-curve level falls below $V_{D2}$ which is one of two lower threshold values at time $t_1$, the detuning detection signal $S_1$ is produced. At this time, the clock pulses are subjected to frequency division and the resultant output is applied to the up/down counter as the up directional count input. In this condition, the searching speed is lowered. When the S-curve output level passes another lower threshold value $V_{D1}$ of the comparator at time $t_2$, the detection signal $S_1$ disappears, and the frequency is further varied at the same speed in the up direction. At time $t_3$ when the S-curve output level reaches $V_{U1}$ which is one of two upper threshold values of the comparator, the detection signal $S_2$ is produced. In order to measure the time period T from time $t_2$ to time $t_3$, a time measuring up/down counter is employed to which clock pulses having a half frequency of the frequency divided clock pulses are fed so that a half number of the frequency divided clock pulses during the time period T, i.e. 5, is up counted. In response to the occurrence of the detection signal $S_2$, the frequency controlling up/down counter is operated to effect down counting to thereby decrease the frequency. When the S-curve level falls to another upper threshold value $V_{U2}$, the detection signal $S_2$ disappears at time $t_4$ while the frequency continues to decrease at the constant speed. During the time period Ta from time $t_3$ to time $t_4$ during which time the detection signal $S_2$ is produced, the time measuring up/down counter is operated to effect down counting of half-frequency clock pulses so that the remaining value in the time measuring counter will correspond to $(T-Ta)/2$.

After time $t_4$, the clock pulses subjected to the frequency division are again used directly and the down counting is continued. At time $t_5$, the count value of the time measuring up/down counter becomes zero whereupon a borrow output is produced therefrom. In response to the borrow output, the searching operation is terminated. Accordingly, the searching operation is terminated after passing time period $Ta+(T-Ta)/2$ measured from time $t_3$. Thus, the tuning point is set to the center ($f_0$) of the S-curve and exact tuning is accomplished.

Figure 6:
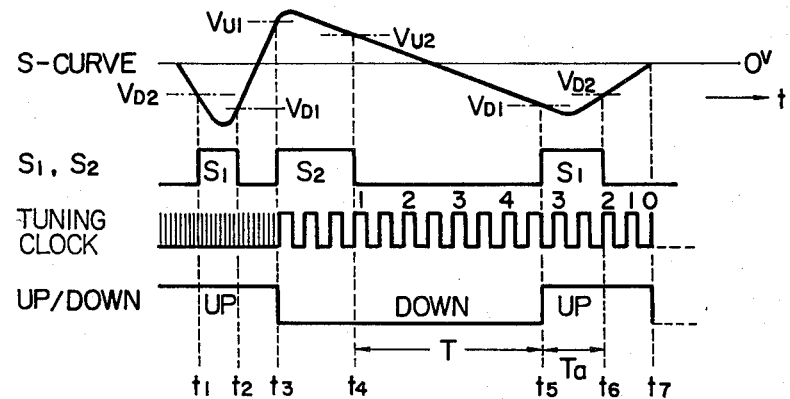

FIG. 6 is a waveform diagram for description of another example of the controlling operation according to the invention. According to this example, the operational speed of the tuning is increased in comparison with the operation as illustrated in FIG. 5. In response to the tuning frequency up-instruction signal, clock pulses having a predetermined frequency are fed to the up/down counter as the up directional count input and thus the tuning frequency increases at high speed in sequence. During the time period from time $t_1$ at which the S-curve output passes the lower threshold value $V_{D2}$ of the comparator until time $t_3$ at which the S-curve output reaches the upper threshold value $V_{U1}$, up operation of the frequency is carried out at high speed without lowering the search speed. In response to the occurrence of the detection signal $S_2$, the speed of the searching operation is lowered and the up/down counter is controlled to effect down counting to thereby decrease the frequency at the lower speed. This frequency lowering operation is continued until time $t_5$ at which the S-curve output again falls to the lower threshold valve $V_{D1}$. When the detection signal $S_1$ is again produced, the up/down counter is again controlled to effect up counting, thereby increasing the frequency. When the S-curve output level again reaches lower threshold value $V_{D2}$ at time $t_6$, the detection signal $S_1$ disappears. However, the frequency is further increased at the constant low speed.

In order to measure the lowering operational period T from time $t_4$ until $t_5$, a time measuring up/down counter is employed to which clock pulses having a half of the frequency of the frequency divided clock pulses are fed as up directional input clock, which is four (4) in this case. In the time period Ta during which time the detection signal $S_1$ is produced, the time measuring up/down counter is controlled to effect down counting of half frequency clock pulses and the counter value is set to three (3) corresponding to the time period (T−Ta)/2.

After time $t_6$, the time measuring up/down counter continues down-counting with the clock pulses being subjected to the frequency division. At time $t_7$, the count value of the time measuring up/down counter becomes zero whereupon the borrow output is produced therefrom, thereby terminating the searching operation. In this manner, exact tuning control is carried out at high speed.

Figure 8:
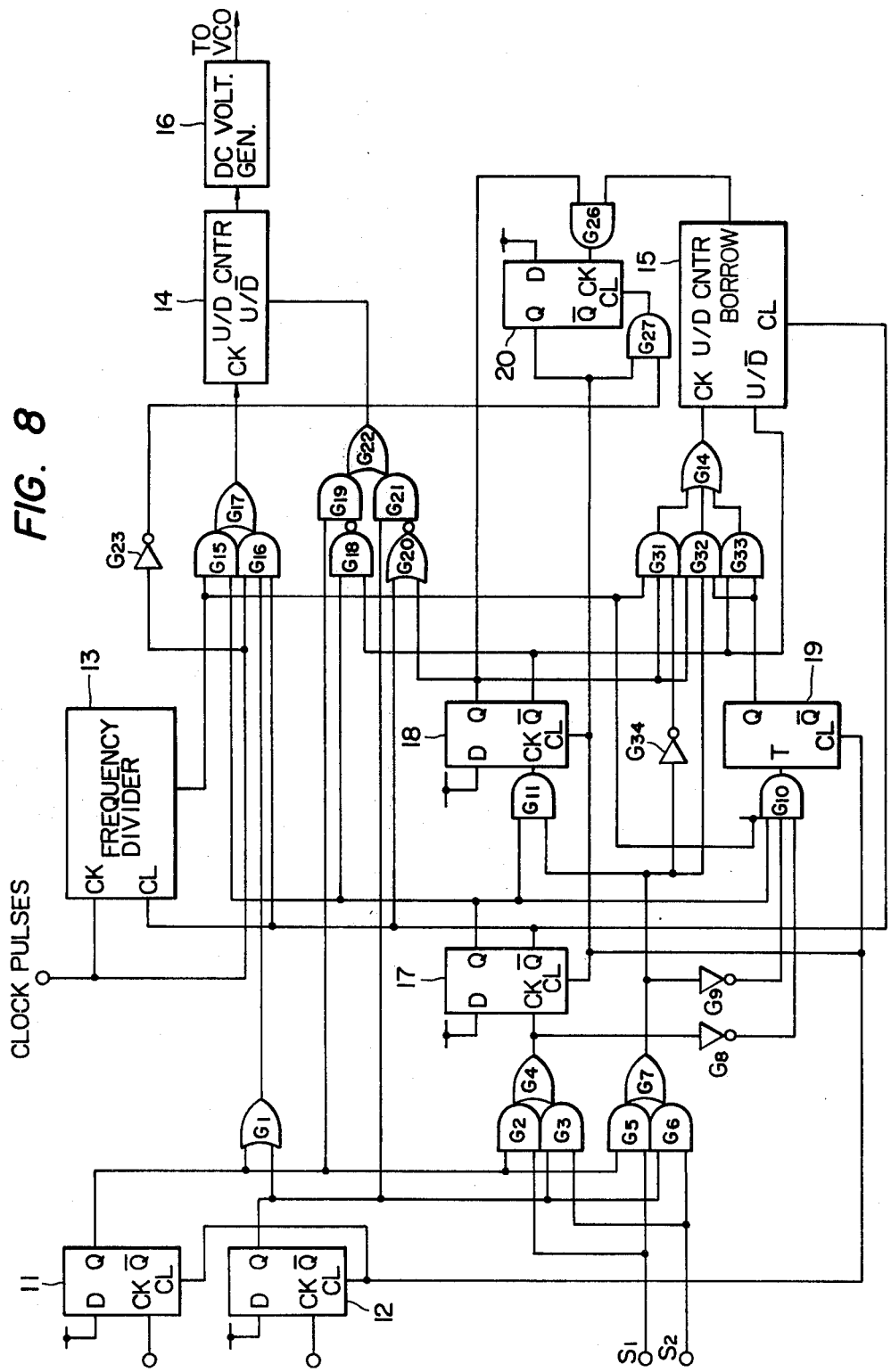

FIG. 8 is a circuit block diagram for implementing the controlling operation as illustrated in FIG. 6.

FIG. 8 is similar to FIG. 7 in the circuit arrangement, and thus a detailed description of the overlapping operation is omitted.

Since the AND gate $G_{11}$ is disabled even if the first detection signal $S_1$ is produced at time $t_1$, the content of FF 18 is not changed. Accordingly, the output of OR gate $G_{22}$ is maintained at H level. Further, since the content of FF 17 is not changed, the gate $G_{17}$ permits the clock pulses to pass therethrough and the clock pulses are applied to the clock terminal CK of the counter 14. Consequently, high speed up search is continuously carried out.

When FF 17 is set in accordance with the occurrence of the second detection signal $S_2$, the clear conditions of the frequency divider 13 and the time measuring up/down counter 15 are dissolved. The gate $G_{16}$ is disabled and the gate $G_{15}$ is enabled so that the clock pulses which are subjected to $\frac{1}{8}$ frequency division are fed to the clock terminal CK of the up/down counter 14. In addition, since the gate $G_{19}$ is also disabled both the inputs of the gate $G_{22}$ are changed to L levels and thus the up/down instruction signal to the counter 14 is changed to L level, thereby commencing the down directional counting operation.

The gate $G_{10}$ is enabled when the detection signal $S_2$ changes to L level at time $t_4$, and the frequency divided output from the frequency divider 13 is further subjected to $\frac{1}{2}$ frequency division by FF 19. The output of FF 19 is applied through gates $G_{33}$ and $G_{14}$ to the clock input CK of the time measuring up/down counter 15. At this time, since the up/down instruction signal applied to the counter 15 is a H level, the counter 15 effects up directional counting. When the receiving frequency gradually decreases, the third detection signal $S_1$ is raised to H level and then FF 18 is set. Therefore, the gate $G_{18}$ produces an H level output and accordingly the up/down instruction signal of the counter 14 is again changed to H level, thereby causing the counter 14 to effect up directional counting. Thus, the receiving frequency is increased. Since a gate $G_{31}$ is disabled and a gate $G_{32}$ is enabled while the detection signal $S_1$ is at H level (Ta), the input of the counter 15 is the output of Ff 19 which receives the output of the frequency divider 3 and further divides by half.

When the detection signal $S_1$ falls to the L level, the gate $G_{32}$ is disabled and the gate $G_{31}$ is enabled, so that the output of the frequency divider 13 is directly fed to the input of the counter 15. When the borrow output is produced from the counter 15, it is applied through the AND gate $G_{24}$ to FF 20 to set the latter, and therefore FFs 17, 18 and 19 and FFs 11 and 12 are cleared, thereby terminating the searching operation.

From the foregoing description, it can be appreciated that inaccuracy of the tuning point due to the hysteresis characteristic of the window comparator is compensated and an optimum tuning is obtained according to this invention. Particularly, high speed operation can be achieved by employing the operational system as shown in FIG. 4 or 6 with the use of the circuit examples shown in FIG. 7 or 8.

Although this invention has been described with respect to specific embodiments, it will be appreciated that this invention is not limited thereto, but various changes or modifications are possible without departing from the spirit and scope of the invention as defined in the appended claims. For example, it is possible to modify the control system by using a micro processor.

What is claimed is:

1. In a tuning frequency automatic control device of a receiver of the type comprising first frequency varying means for varying the tuning frequency of said receiver in a first direction at a first speed in response to a first instruction signal and detection means for detecting the tuning condition of said receiver and producing a first detection signal ($S_1$) when said receiver is detuned in one direction from a desired station and a second detection signal ($S_2$) when said receiver is detuned in another direction from said desired station, the improvement comprising:

second frequency varying means for varying the tuning frequency of said receiver for at least a first period of time in a second direction opposite to said first direction and at a second speed slower than said first speed in response to a second detection signal subsequent to a first detection signal:

third frequency varying means for varying said tuning frequency in said first direction at said second speed in response to a first detection signal subsequent to said subsequent second detection signal; and halt signal generating means for halting the variation of said tuning frequency by said third frequency varying means after a second period of time which is half of said first period of time.

2. The device as recited in claim 1 wherein said first, second and third frequency varying means collectively include a first up/down counter, said first frequency varying means further including means for supplying clock pulses of a first frequency to said first up/down counter as a count input of said first direction, said second frequency varying means further including means for supplying clock pulses of a second frequency smaller in frequency than said first frequency to said first up/down counter as a count input of said second direction, and said third frequency varying means further including means for supplying said second frequency clock pulses to said first up/down counter as a count input of said first direction, and wherein the tuning frequency is controlled in accordance with the count value of said first up/down counter.

3. The device as recited in claim 2 wherein said halt signal generating means comprises a second up/down counter, means for supplying to said second up/down counter during said first period of time clock pulses having a frequency of half of said second frequency as a count input of said first direction and for supplying to said second counter clock pulses of said second frequency as a count input of said second direction during said second period of time, and herein a borrow output produced from said second up/down counter is used as a frequency variation halt instruction signal.

4. The device as recited in claims 1, 2 or 3 wherein said first and second detection signals are pulse signals having leading and trailing edges, wherein said second frequency varying means varies said tuning frequency in said second direction commencing with said leading edge of said second detection signal until said leading edge of said subsequent first detection signal, and wherein said first period of time is measured from said trailing edge of said second detection signal until said leading edge of said subsequent first detection signal.

5. In a tuning frequency automatic control device for a receiver of the type including level comparison means having a hysteresis characteristic and producing a first detection signal when the tuning frequency of said receiver is outside of a frequency range in one direction and a second detection signal when said tuning frequency is outside of said frequency range in another direction, the improvement comprising:

first frequency varying means for varying said tuning frequency in a first direction at a first speed;

second frequency varying means for varying said tuning frequency at said first speed in a second direction reverse to said first direction in response to a second detection signal subsequent to said first detection signal; and half signal generating means for halting the variation of said tuning frequency by said second frequency varying means after a time period of $Ta+(T-Ta)/2$ from the occurrence of said second detection signal, wherein T is a time period from said first detection signal to said second detection signal and Ta is the duration of said second detection signal.

6. The device as recited in claim 5 wherein said first and said second frequency varying means collectively include a first up/down counter, said first frequency varying means further comprising means for supplying clock pulses of a predetermined frequency to said first up/down counter as a count input of said first direction, said second frequency varying means further comprising means for supplying said clock pulses to said first up/down counter as a count input of said second direction, and wherein said tuning frequency is controlled in accordance with the count value of said first up/down counter.

7. The device as recited in claim 6 wherein said halt signal generating means comprises a second up/down counter, said second up/down counter receiving as a count input of said first direction clock pulses having frequency of half of said predetermined frequency, said half-frequency pulses being generated in a duration from the occurrence of said first detection signal until the occurrence of said second detection signal, and said second counter receiving said half frequency clock pulses as a count input of said second direction during the occurrence of said second detection signal, said clock pulses of said predetermined frequency being supplied to said second up/down counter as the count input of said second direction in response to disappearance of said second detection signal, and wherein a borrow output produced from said second up/down counter is used as a frequency variation halt signal.

8. The device as recited in claim 7, wherein said first and second detection signals each have leading and trailing edges, and said time period T is measured from the trailing edge of said first detection signal to the leading edge of said second detection signal.

9. The device as claimed in claim 8, wherein said leading and trailing edges of each of said detection signals occur at different tuning frequencies.

* * * * *